United States Patent [19]
Wessling

[11] Patent Number: 5,846,606
[45] Date of Patent: Dec. 8, 1998

[54] PROCESS FOR THE PRODUCTION OF METALLIZED MATERIALS

[75] Inventor: Bernhard Wessling, Bargteheide, Germany

[73] Assignee: Zipperling Kessler & Co. (GmbH&Co.), Ahrensburg, Germany

[21] Appl. No.: 875,480
[22] PCT Filed: Nov. 26, 1996
[86] PCT No.: PCT/EP96/05220
 § 371 Date: Jul. 29, 1997
 § 102(e) Date: Jul. 29, 1997
[87] PCT Pub. No.: WO97/20084
 PCT Pub. Date: Jun. 5, 1997

[30] Foreign Application Priority Data

Nov. 29, 1995 [DE] Germany ............ 195 44 543.0

[51] Int. Cl.$^6$ .............. B05D 1/38; B05D 3/04; B05D 3/10
[52] U.S. Cl. .......... 427/340; 427/341; 427/404; 427/405
[58] Field of Search ............... 427/340, 341, 427/404, 405

[56] References Cited

U.S. PATENT DOCUMENTS

| | | | |
|---|---|---|---|
| 5,237,023 | 8/1993 | Oka ........................ | 525/540 |
| 5,300,208 | 4/1994 | Angelopoulos et al. ..... | 205/50 |
| 5,373,629 | 12/1994 | Hupe et al. . | |

FOREIGN PATENT DOCUMENTS 63-303077  12/1988  Japan .

OTHER PUBLICATIONS

Annual Tech. Conf. –Soc. Plast. Eng. (1991), 49th, 864–7, 1991.
Mater. Corros., 47(8), 439–445, 1996.
Jot, J. Oberflaechentech, 37(6), 18–20, 1997.
Angelopoulos et al: "Lithographic Applications of Conducting Polymers", Journal of Vaccum Science and Technology Part B, vol. 9, No. 6, Nov. 1, 1991, pp. 3428–3431, XP000268560.
Database WPI, Section Ch, Week 8730, Derwent Publications Ltd., An 87–211397 –XP002027770 & JP 62 139 896 A, Jun. 23, 1987, see abstract.
Database WPI, Section CH, Week 9518, Derwent Publications Ltd., AN 95–135018 –XP002027771 & JP 07 058 478 A, Mar. 3, 1995, see abstract.

*Primary Examiner*—Erma Cameron
*Attorney, Agent, or Firm*—Cushman Darby & Cushman Intellectual Property Group of Pillsbury Madison & Sutro LLP

[57] ABSTRACT

A process is described for metallizing materials such as plastics, glasses, ceramics and metals, in which (a) the material to be metallized is provided with a coating which contains intrinsically conductive polymer, (b) the intrinsically conductive polymer is activated by reduction and (c) the metal is applied to the material in a non-electrochemical manner by bringing the coated material into contact with a solution containing ions of the metal.

10 Claims, 2 Drawing Sheets

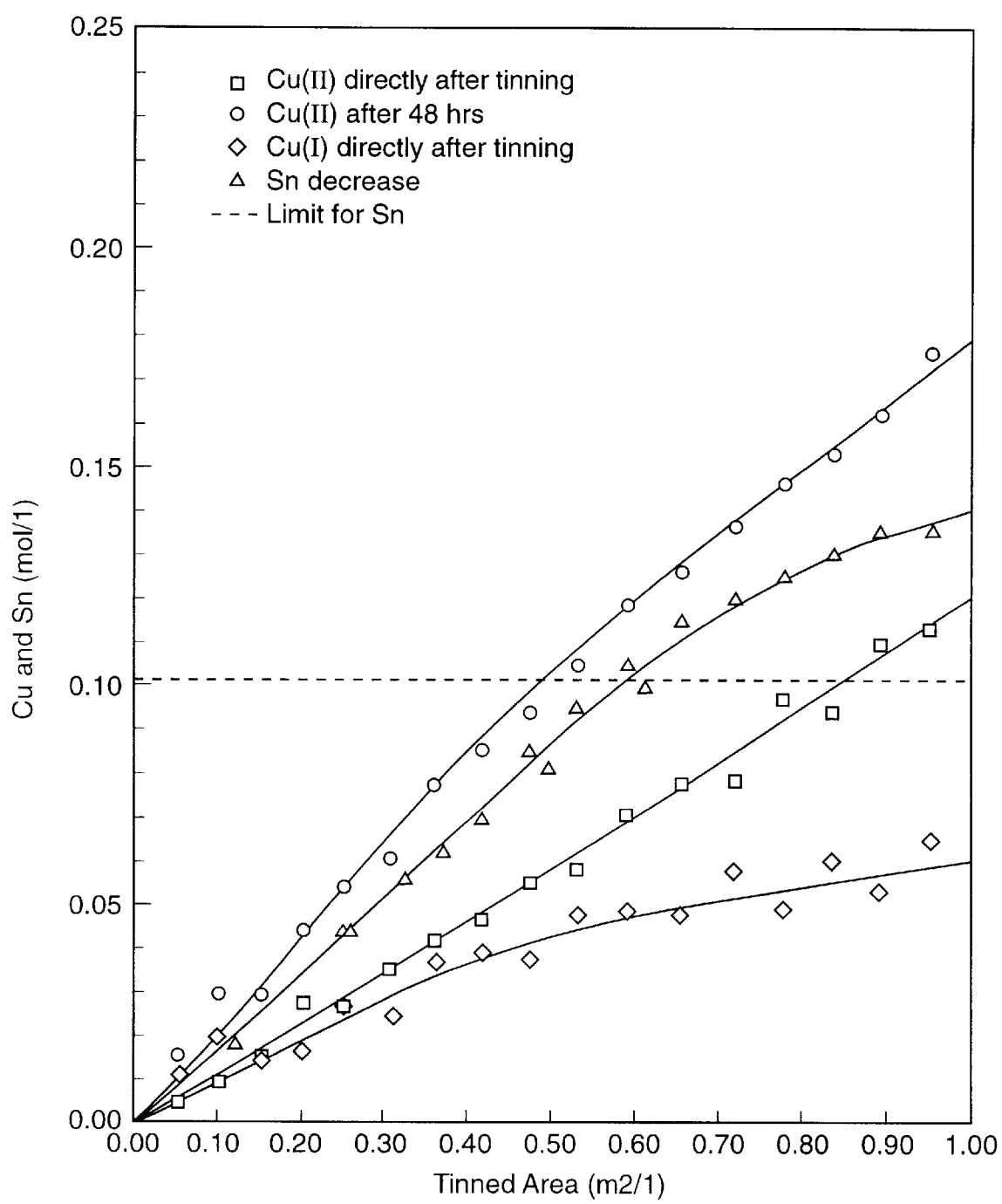
PRIOR ART *Fig. 2*

PROCESS FOR THE PRODUCTION OF METALLIZED MATERIALS

This application is the national phase of international application PCT/EP96/05220, filed Nov. 29, 1996 which was designated in the U.S.

The invention relates to a process for the production of metallized materials and in particular to such a process in which the desired metal is deposited on the material in a non-electrochemical manner.

Applying metal layers to non-conductive materials or conductive materials, such as metals, is a technique necessary in many branches of industry and practised in very different variants. The aim of this treatment is in particular to obtain antistatic or conductive surfaces or to make available an electromagnetic shielding. Furthermore, metallizing can serve to achieve a desired optical effect, such as a metallic "look", or to obtain improved or more abrasion-resistant surfaces. Finally, the metallization of material surfaces is also of great importance in the production of printed circuit boards.

In order to carry out the metallization, i.e. applying the metal to the material, non-electrochemical processes, which are also called chemical deposition processes, are also known in addition to electrochemical processes. A suitable surface treatment of the material generally precedes such chemical processes, and they are known for various metals such as Au, Ag, Pd, Cu, Sn or Ni. Electrochemical methods are often additionally used after prior chemical metallization, in order to increase the layer thickness of the applied metals.

In various applications, however, the known chemical processes result in the applied metal layers or the metallized materials having inadequate properties. The layers obtained are often only irregularly structured or they exhibit inadequate elasticity or they are too brittle. Furthermore, the known processes are not very efficient, since they often require the use of large quantities of mostly toxic chemicals.

The object of the invention is therefore to provide a non-electrochemical process for the production of metallized materials, which is superior to the known processes with regard to the above-mentioned aspects.

This object is surprisingly achieved by the process of the invention according to claims 1 to 10.

Moreover, the invention relates to the use of intrinsically conductive polymers in the non-electrochemical application of metals to materials.

BRIEF DESCRIPTION OF THE DRAWINGS

FIG. 2 illustrates the results from the practice according to the prior art.

Figure 1:
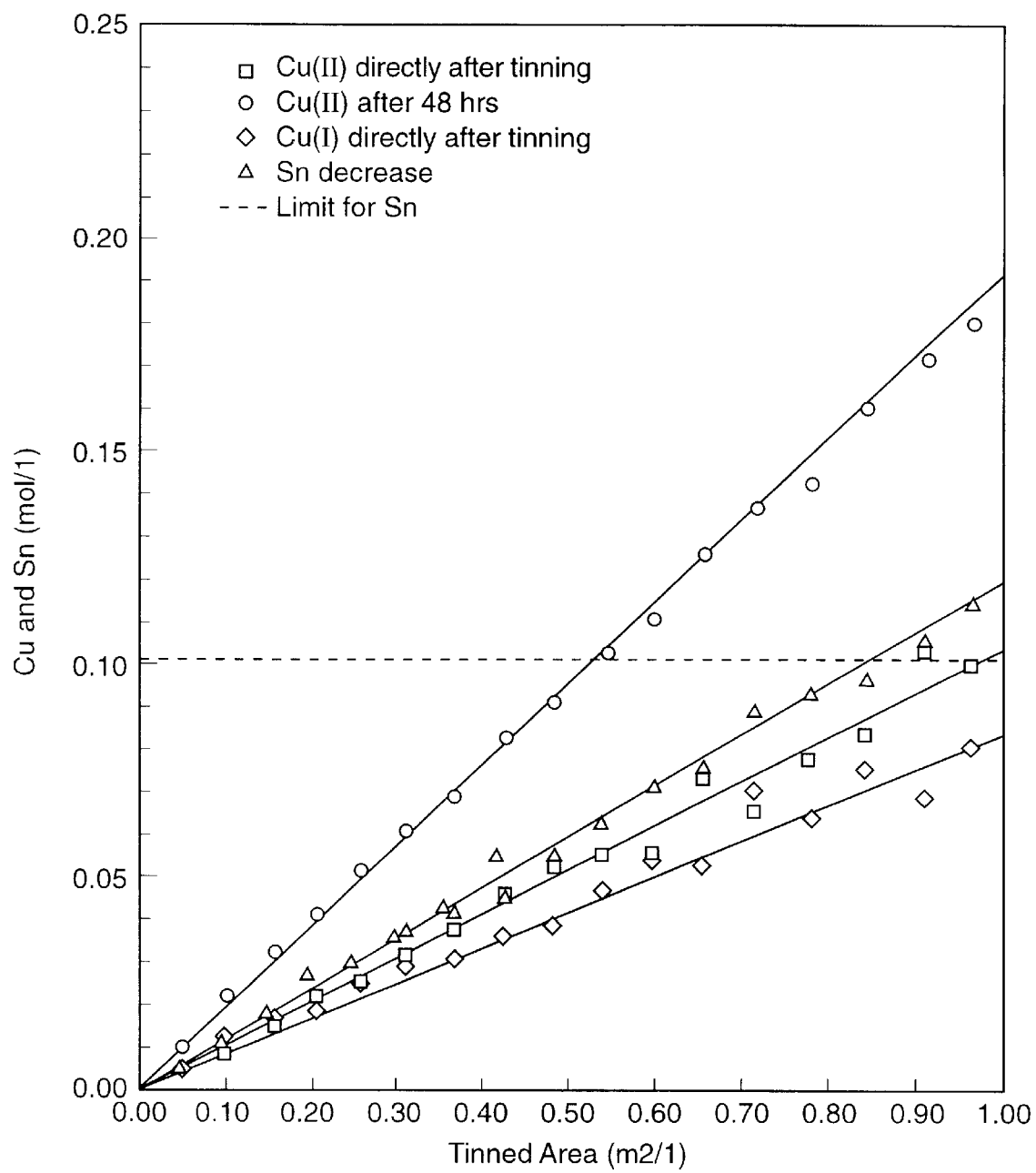
FIG. 1 illustrates the results from the practice of the present invention.

The process according to the invention for the production of metallized materials is characterized in that (a) the material to be metallized is provided with a coating which contains intrinsically conductive polymer, (b) the intrinsically conductive polymer is activated by reduction and (c) the metal is applied to the material in a non-electrochemical manner by bringing the coated material into contact with a solution containing ions of the metal.

"Intrinsically conductive polymers" used in the process are understood to be those organic polymers which have polyconjugated bonding systems, e.g. double bonds, aromatic or heteroaromatic rings or triple bonds. Examples of such polymers are polydiacetylene, polyacetylene (PAc), polypyrrole (PPy), polyaniline (PAni), polythiophene (PTh), polyisothianaphthene (PITN), polyheteroarylene vinylene (PArV), in which the heteroarylene group can be e.g. thiophene or pyrrole, poly-p-phenylene (PpP), polyphenylene sulphide (PPS), polyperinaphthalene (PPN), polyphthalocyanine (PPhc) and their derivatives (which are formed e.g. of substituted monomers), their copolymers and their physical mixtures. They can exist in various states, which are described by empirical formulae differing in each case and can be converted into one another, in most cases essentially reversibly, by reactions such as oxidation, reduction, acid/base reaction or complexation. These reactions are sometimes also called "doping" or "compensation" in the literature. At least one of the possible states is electrically very conductive, e.g. having a conductivity of more than 1 S/cm (as pure substance), so that it is possible to refer to them as intrinsically conductive polymers. From time to time, the intrinsically conductive polymers are also called "organic metals" in the literature.

A good overview of intrinsically conductive polymers already synthesized to date which are suitable according to the invention can be found e.g. in Synthetic Metals, issues 17, 18 and 19 (1987).

The coating applied in stage (a) can in particular be a polymer blend containing intrinsically conductive polymer. In addition to intrinsically conductive polymer, the polymer blends used according to the invention contain further polymers, copolymers or polymer mixtures, such as e.g. polyamides, polyesters, polyethers, such as polyethylene oxides, copolymer latices based on water, such as e.g. vinyl acetate butyl acrylate, or other copolymer latices, and/or polyvinyl alcohols. Particularly preferred further polymers are polyamides.

Advantageous polymer blends contain preferably 0.1 to 45 wt. % and particularly preferably 5 to 35 wt. % of intrinsically conductive polymer.

It is also possible for pure intrinsically conductive polymers to be used as a coating.

It has also proved to be particularly advantageous if the intrinsically conductive polymer is used in the form of a dispersion. This can be a dispersion in organic solvents, such as alcohols or N-methylpyrrolidone, or in aqueous solvents. The dispersions can also contain binders, such as polymeric or film-forming binders, e.g. the further polymers given above as a component of polymer blends.

Polyaniline is used as a preferred intrinsically conductive polymer.

Usual processes, such as e.g. mechanical deposition using a doctor blade or immersion in solutions or dispersions of intrinsically conductive polymer, can be used to apply the coating.

In process stage (b), an activation of the intrinsically conductive polymer takes place in which it is reduced. The reduction can take place e.g. by an electrochemical method, i.e. by means of an electric current applied from outside. However, it is preferred for the reduction to be carried out by using chemical reducing agents. Coming into consideration as chemical reducing agents are, in particular, $H_2$, hydrides such as boron hydrides, e.g. $BH_3$, and/or metals having a reducing effect in respect of the intrinsically conductive polymer, e.g. iron, aluminium or copper. Whether a metal has a reducing effect in respect of the polymer naturally depends on the actually chosen conditions in which reduction takes place. For example, the pH value and the presence of complexing agents can exert an important influence.

Hydrazine and hydrazine compounds, such as hydrazine salts, e.g. hydrazinium sulphate, have proved to be particularly preferred reducing agents.

In order to improve the stability and reproducibility of the activation, the reduction preferably takes place in a degassed, i.e. low-oxygen or oxygen-free, medium. However, special applications of the process are also conceivable, in which the presence of oxygen is not disadvantageous, but even desirable.

In the case of the polyaniline preferably used as intrinsically conductive polymer, the reduction can often also be recognized by a colour change which has its origin in the formation of the reduced form of polyaniline, so-called leucoemeraldine.

In process stage (c), the selected metal is applied to the material in a non-electrochemical manner by bringing the coated material into contact with a solution containing metal ions.

This process stage is usually carried out after stage (b). However, it is also possible for the non-electrochemical application of the metal on the coated material to also already take place simultaneously with the reduction. An example of this is the tinning according to the invention of copper, as is described in more detail below and in the examples. In some cases, the simultaneous conducting of (b) and (c) can, however, be undesired, e.g. on account of the incompatibility with one another of chemicals used in (b) and (c) or for technical reasons.

Application in "a non-electrochemical manner" is understood to be a process in which the application is not carried out by using an electric current applied from outside. Rather, the material provided with the polymer-containing coating is brought into contact with the metal ions solution, for which simple immersion in the solution is usually sufficient.

The solution is preferably one with mono- or divalent cations of the metal, and in particular an aqueous solution with a pH value of <7 is used.

The process according to the invention allows simple and efficient metallization of materials with metals, and it has proved to be advantageous in particular in applying Cu, Ag, Pd, Sn, Pt and/or Ni. The process is particularly preferably used for the application of Cu, Ag or Sn.

Materials coming into consideration are principally plastics of all types, in particular those containing polyamide or polyethylene terephthalate, glasses or ceramics. However, other materials such as e.g. metallic materials can also be metallized using the process according to the invention.

Regarding the mechanism of the process according to the invention, it is assumed that the reduced intrinsically conductive polymer of the coating functions as an electron carrier and therefore as a catalyst and that the reducing agent used does not interact directly with the ions of the metal to be deposited or does not reduce them directly. The electron transfer from the intrinsically conductive polymer onto the metal cations then results in a deposition of elemental metal on the coated material. The concomitant oxidation of the conductive polymers leads at least partially to a regeneration of the conductive polymer used and opens up the possibility of subjecting it again to the reduction and deposition stages (b) and (c). In view of this proposed reaction mechanism, it is thus possible to talk of a catalytic activity of the intrinsically conductive polymer.

The deposition according to the invention of tin on copper is particularly illustrative of the surprising catalytic mode of operation of the coating with intrinsically conductive polymer.

In the conventional non-electrochemical tinning of copper, $Sn^{2+}$ solutions containing methane sulphonic acid and thiourea are customarily used for example. The task of the thiourea is apparently to allow the copper to be dissolved by complexation with $Cu(+I)$, since methane sulphonic acid alone does not dissolve or begin to dissolve copper. Furthermore, on account of the more negative potential of the $Cu(I)$ thiourea complex relative to uncomplexed $Cu(I)$, an electron transfer to $Sn^{2+}$ and therefore its reduction to $Sn^0$ are made possible.

Expressed in moles, the amount of Cu dissolved during this tinning of copper must theoretically be twice the amount of Sn that it is wished to deposit. In actual fact, however, careful analysis of the increase in the $CU(II)$ concentration and of the decrease in the $Sn(II)$ concentration in the tinning solution during the tinning of relatively large Cu surfaces in operational applications results in a $Cu(II):Sn(deposited)$ ratio of 1.22 instead of 2. The reason for this is not yet known in the literature.

As FIG. 2 shows, the increase in the $Cu(II)$ concentration and the decrease in the $Sn(II)$ concentration in the case of conventional non-electrochemical tinning deviate from the initially correct linear development above certain concentrations. This is the phenomenon, known from the technical literature and indicated by manufacturers, that the tinning no longer proceeds as desired above a Cu concentration of 0.08 mol/l and below an $Sn(II)$ concentration of 0.1 mol/l, respectively, and therefore the tinning bath can no longer be used, but must be replaced. As an explanation, it is stated that, outside the recommended concentration ranges, undesired intermetallic phases $(Sn_x/Cu_y)$ are deposited instead of pure tin layers. The functioning of the tin on the copper layer is then no longer guaranteed.

The deviation from linear behaviour is particularly great if, instead of the total concentration of $Cu(II)$—which for chemical reasons can be determined only after several days when the total $Cu(I)$ quantity has been converted by atmospheric oxygen into $Cu(II)$—that $Cu(II)$ quantity is detected which occurs immediately during the coating process. By doing that the dynamics of the $Cu(I)/Cu(II)$ reactions are grasped, the difference between the total quantity of dissolved copper ions and those which we wish to call "dynamic" being $Cu(I)$. In FIG. 2, this curve is called "$Cu(I)$ after tinning", and it is particularly non-linear as soon as the critical Cu concentration is reached.

If, instead of uncoated copper surfaces, surfaces are used which according to the invention are provided with a thin coating with conductive polymer, which is reduced by the copper under the tinning conditions, a completely different behaviour occurs. The $Cu(II):Sn(deposited)$ ratio now approaches the ideal value of 2 and is 1.63. Moreover, as FIG. 1 shows, the increase in the total $Cu(II)$ concentration and also in the dynamic $Cu(I)$ concentration and the decrease in the $Sn(II)$ concentration is linear over the entire concentration range. The concentration development is also clearly linear well above the critical concentrations, without changing the slope. This behaviour in the case of the tinning according to the invention is discussed in more detail in Example 3.

These results are parallel to those which emerge from the analysis of the achieved layer thickness of tin. It is shown that the layer thickness in the tinning of copper without a coating with intrinsically conductive polymer clearly decreases from ca 0.6 $m^2/l$ (area of copper per volume of tinning solution), whereas it remains essentially constant in the case of tinning carried out according to the invention.

It emerges from this as a practical advantage of the process according to the invention that no intermetallic phases are deposited which are able to reduce or to stop the intended function of the tin layer, and the surface area that can be coated per liter of tinning bath used is more than twice that which can be coated with conventional chemical deposition processes.

The case of the tinning of copper according to the process of the invention clearly shows the catalytic function of the intrinsically conductive polymer used. It is assumed that in the case of this special metallization, e.g. in the case of polyaniline as polymer, the latter is reduced by $Cu^0$ to leucoemeraldine, which then in turn reduces $Sn^{2+}$ to $Sn^0$, while the oxygen present oxidizes Cu to $Cu^{2+}$.

In each case, immersion of a copper plate coated with the polymer in salt-containing water already results in the reduction of the polyaniline, which can also be determined optically, when the layer thicknesses of polyaniline are great enough, e.g. 1–5 $\mu$m, from its discoloration which is to be attributed to the formation of the colourless leucoemeraldine as a reduced form.

Finally, the invention also relates to the use of intrinsically conductive polymers in the non-electrochemical application of metals to materials. The procedure is in particular as was described above for the process according to the invention.

Advantageously, the use is effected by (a) providing the material to be metallized with a coating which contains intrinsically conductive polymer, (b) activating the intrinsically conductive polymer by reduction and (c) applying the metal to the material in a non-electrochemical manner by bringing the coated material into contact with a solution containing ions of the metal.

The invention is explained in more detail below with reference to examples.

EXAMPLES

Example 1

Metallization of Polyamide with Copper

A polyamide-based polymer blend containing 4 wt. % of polyaniline, namely Ormecon 900187/34 from Ormecon Chemie, Ahrensburg, was applied to a polyamide film of PA6 Ultramid B3L from BASF using a doctor blade in a layer thickness of 100 $\mu$m. The coating was green. The film was dried for 20 minutes at 80 ° C.

For the metallization, the coated film was immersed in 1 N sodium hydroxide solution which contained 13 g/l of hydrazinium sulphate, and was kept there under nitrogen at room temperature for 24 hours for the reduction. On immersion in the reduction medium, the coating immediately turned deep blue. In the course of the reduction, the colour of the polyaniline layer changed to grey. After removal from the reduction solution, the film was rinsed with distilled water under nitrogen and immediately transferred into a solution of 0.1 N copper tosylate/0.01 N dodecyl benzenesulphonic acid having a pH value of 4. Here it was left under nitrogen for 5 hours for copper deposition. The colour of the surface changed to greenish brown. After subsequent rinsing with distilled water, the surface was immersed in aqueous ammonia solution for one minute to remove adherent copper salts. After further rinsing with water, the now bronze-coloured film was dried in air.

All of the above treatments, unless otherwise stated, were carried out at room temperature, and the solutions used were freshly prepared, degassed and rinsed with nitrogen for 5 minutes prior to use.

The copper deposited on the polyaniline was identified from peaks at 8.05 and 8.91 keV by X-ray fluorescence analysis using excitation with a Ge target at 25 kV and 1.0 mA.

By repeating the chemical redox processes, i.e. reduction and metal deposition, several times, it was possible to increase the quantity of deposited copper further.

Example 2

Metallization of Polyethylene Terephthalate with Silver

A polyamide-based polymer blend containing 4 wt. % of polyaniline, namely Ormecon 900187/34 paint from Ormecon, Ahrensburg, was applied to a polyethylene terephthalate (PET) film using a doctor blade in a layer thickness of 50 $\mu$m. The PET film coated green with the paint was after a drying period of 10 minutes at 80° C. metallized with silver.

For this purpose, the coated PET film was immersed in sodium hydroxide solution which contained 30 g/l of hydrazinium sulphate. The pH value of the solution was 9 to 10. The film was kept in this solution under nitrogen for 12 hours for the reduction. The coating of the film, which immediately turned blue on immersion in the solution, had a yellow colour after the reduction. After removal from the reduction solution, the film was rinsed with distilled water under nitrogen and immediately immersed for 30 minutes in a 0.33 molar para-toluene sulphonic acid solution having a pH value of 1, which contained 11.2 g/l of silver nitrate, for the silver deposition. The colour of the surface of the film changed to green. After a few minutes, a silver deposition was already to be recognized. After rinsing with distilled water, the film was dried in air. All of the above treatments, unless otherwise stated, were carried out at room temperature, and the solutions used were freshly prepared, degassed and rinsed with nitrogen for 5 minutes prior to use.

The silver deposited on the polyaniline coating was clearly identified from peaks at 2.98, 3.14 and 3.23 keV by X-ray fluorescence analysis. In addition, only the sulphur peaks at 2.30 and 2.47 keV which originated from the counterions of the polyaniline were recognizable.

Example 3

Chemical Deposition of Tin on Copper

The surface of copper plates was chemically tinned. The tinning took place according to the invention with coating of the copper plates with an aqueous polyaniline dispersion, e.g. Ormecon 900236/04 from Ormecon Chemie, Ahrensburg. For comparison, the tinning was also carried out without a polyaniline coating.

Procedure

The area of the copper plate that was to be tinned was determined by measuring. The plate was microetched in order to degrease the surface and to remove the oxide layer or a zinc or chromate layer protecting the copper from tarnishing. For this, the copper plate was immersed in the acid pickle Circuposit Etch 3330, customary in the trade, based on sulphuric acid and peroxide from the company Shipley, Germany, for two minutes at room temperature. The plate was then rinsed with water and immersed in an aqueous polyaniline dispersion, namely the Ormecon 900236/04 concentrate (Ormecon Chemie, Ahrensburg) diluted with water in a ratio of 1:19, for one minute in order to apply a polyaniline coating. After rinsing with water, the plate was non-electrochemically tinned at 50° C. in the tinning solution Tinposit LT-34 Immersion Tin solution (Shipley, Germany) by immersing it in this solution. The tinning solution contains $Sn^{2+}$ ions, phenolsulphonic acid and thiourea. The deposition reaction started as soon as the plate was immersed. The plate was taken out of the tinning bath after 20 minutes, rinsed with water and dried. The surface was now coated with a satin-finished, silver-coloured tin layer.

For comparison, the above steps were repeated but with the difference that a polyaniline coating was not applied.

Analysis

A. Determination of Tin in the Tinposit LT-34 Immersion Tin Solution

Tin, which was present in 2-valent form, was quantitatively determined directly in a solution buffered with sodium acetate by titration using Titriplex III with xylenol orange as indicator.

Measurement Procedure 2 ml of the Tinposit LT-34 Immersion Tin solution were diluted to 100 ml with water, mixed with 1 ml of conc. HCl and set to a pH value of approximately 4 with sodium acetate. After xylenol orange indicator trituration had been added, titration was carried out with 0.1 N Titriplex III solution from violet to the last permanent colour change to bright yellow.

Calculation 1 ml 0.1 mol/l Titriplex III solution =11.869 mg Sn

B. Determination of Copper in the Tinposit LT-34 Immersion Tin Solution

Copper, which was present in 2-valent form, was determined spectrophotometrically by addition of ammonia as copper tetraamine complex.

Measurement Procedure 0.5 ml of the Tinposit LT-34 immersion Tin solution were mixed with 5 ml of conc. ammonia (25%, superpure), shaken well, and the white precipitate of $Sn(OH)_2$ (actually hydrated tin II oxide of complicated composition) was filtered off after approximately 5 minutes using a filtering crucible (porosity 3). The clear filtrate was measured in a 10 mm glass cell in the UV/VIS spectrophotometer in the range from 1000 to 400 nm. A pure ammonia solution (25%) was used as a reference spectrum. The concentration of copper ions was determined from the extinction of the maximum at approximately 630 nm using a calibration curve.

Calculation

Calibration curve: $y=0.0913x+0.035$ with y=measured extinction and $x=Cu^{2+}$ in g/l C. Determination of Tin on the Copper Surface In order to determine the layer thickness of the tin deposited on the copper, the tin was dissolved with acid and determined quantitatively in the resultant solution by titration using Titriplex III.

Measurement Procedure

The tin-coated copper plate was immersed in concentrated hydrochloric acid for 10 minutes at 50° C. and then rinsed with water. The rinsing water and the quantity of acid used for the dissolution were combined, made up to 100 ml with water and brought to a pH value of approximately 1 with sodium hydroxide pellets. Sodium acetate was then used to set a pH value of approximately 4, and, after xylenol orange indicator trituration had been added, titration was carried out with 0.1 N Titriplex I I solution from violet to the last permanent colour change to bright yellow.

Measurement Results

The analytical examinations served to determine the tin and copper contents of the Tinposit LT-34 Immersion Tin solution in g/l for the respective $m^2$ of tinned copper plate surface per liter of solution. The decrease in the tin content and the increase in the copper (II) concentration were converted into mol/l to facilitate the comparison. Determination of the copper (II) concentration took place immediately after withdrawal of the tinned plates and 48 hours after the tinning bath had stood at room temperature in air. The tin content did not change over this period, whereas a great increase was to be noted in the copper (II) content. This presumably resulted from the copper (I) ions present in the tinning solution which had been slowly oxidized to copper (II) ions by atmospheric oxygen. Only Cu(II) ions were recorded in the spectrophotometric detection of the copper concentration. The proportion of copper (I) ions in the solution directly after tinning was determined from the difference in the copper (II) concentration after immediate removal and after 48 hours.

In FIGS. 1 and 2, the decrease in tin and the increase in copper in the Tinposit LT-34 Immersion Tin solution are plotted against the $m^2$ of tinned copper surface per 1 of solution used. FIG. 1 shows the behaviour of the copper plate metallized according to the invention and FIG. 2 the behaviour of the conventionally metallized copper plate for comparison, which was not provided with a polyaniline coating.

Comparison of FIGS. 1 and 2 shows that a linear increase in the copper concentration and respectively a decrease in the tin concentration is to be noted over the entire range in the case of the chemical tinning with a pretreatment in an aqueous polyaniline dispersion. The tin deposition takes place on application of a polyaniline layer with still equal layer thickness even after the given limit for the validity range guaranteed by the manufacturer of the tinning solution (Sn content of the solution >18 g/l) has been exceeded. In contrast, in the case of tinning without a polyaniline coating, a negative deviation occurs from approximately 0.45 $m^2/l$ of tinned surface area per 1 of solution, and the quantity of deposited tin decreases when the given limit is exceeded.

I claim:

1. Process for the production of metallized materials, characterized in that
    (a) the material to be metallized is provided with a coating which contains intrinsically conductive polymer,
    (b) the intrinsically conductive polymer is activated by reduction and
    (c) the metal is applied to the material in a non-electrochemical manner by bringing the coated material into contact with a solution containing ions of the metal.

2. Process according to claim 1, characterized in that polyaniline is used as intrinsically conductive polymer.

3. Process according to claim 1, characterized in that the intrinsically conductive polymer is used in the form of a dispersion.

4. Process according to claim 1, characterized in that a polymer blend containing intrinsically conductive polymer is used as coating.

5. Process according to claim 1, characterized in that the reduction takes place by using chemical reducing agents.

6. Process according to claim 5, characterized in that $H_2$, hydrides and/or metals having a reducing effect in respect of the intrinsically conductive polymer are used as chemical reducing agents.

7. Process according to claim 5, characterized in that hydrazine or hydrazine compounds are used as chemical reducing agent.

8. Process according to claim 1, characterized in that the metals Cu, Ag, Pd, Sn, Pt and/or Ni are applied to the material.

9. Process according to claim 1, characterized in that a solution is used which contains mono- or divalent cations of the metal to be deposited.

10. Process according to claim 1, characterized in that an aqueous solution having a pH value of <7 is used.

\* \* \* \* \*